(12) United States Patent
Volz

(10) Patent No.: US 6,461,213 B1
(45) Date of Patent: Oct. 8, 2002

(54) CASING FOR A MODEL VEHICLE RUDDER MACHINE

(75) Inventor: Michael Volz, Offenbach (DE)

(73) Assignee: Volz Modellbau, Offenbach (DE)

( * ) Notice: Subject to any disclaimer, the term of this patent is extended or adjusted under 35 U.S.C. 154(b) by 46 days.

(21) Appl. No.: 09/711,047

(22) Filed: Nov. 13, 2000

(30) Foreign Application Priority Data

Nov. 12, 1999 (DE) .......................................... 299 19 824

(51) Int. Cl.⁷ .............................................. A63H 27/00

(52) U.S. Cl. ............................ 446/46; 446/34; 446/57; 361/600

(58) Field of Search ............................. 446/57, 46, 34; 361/600, 679, 715, 728, 730, 732, 752, 796

(56) References Cited

U.S. PATENT DOCUMENTS

| 4,366,402 A | * | 12/1982 | Marsoner ..................... 310/168 |
| 4,581,933 A | * | 4/1986 | Mansley ..................... 220/235 |
| 6,224,452 B1 | * | 5/2001 | Morse ........................... 446/46 |

* cited by examiner

*Primary Examiner*—Jacob K. Ackun
*Assistant Examiner*—Bena B. Miller
(74) *Attorney, Agent, or Firm*—Collard & Roe, P.C.

(57) ABSTRACT

A casing system for a servo-drive associated with the radio receiver of a remote control system for a vehicle model, in which the servo-drive has a setting member or output arm connectable to the control part of the vehicle model. The casing system comprises a cylindrical mounting frame rigidly connectable with the vehicle model, for enclosing and supporting the servo-drive, and a casing for the servo-drive formed from a plurality of shells whose aggregate has the shape of an approximately circular cylinder. The cylinder of the casing has an outer diameter approximately corresponding with the width of the frame.

12 Claims, 7 Drawing Sheets

CASING FOR A MODEL VEHICLE RUDDER MACHINE

BACKGROUND OF THE INVENTION

1. Field of the Invention

The invention relates to a casing for the rudder machine of vehicle models such as model aircraft. The rudder machine, usually a servo-drive, is associated with the radio receiver of a remote controlling device.

2. The Prior Art

Due to the small size of modern servo-drives, they are installed in aircraft models as close as possible to the rudders, i.e., the servo-drive used for controlling ailerons for example is installed in direct proximity to the aileron in the wing.

The known servo-drives have a block-shaped configuration and are usually supported by rectangular mounting frames. Various fastening means are known for installing such mounting frames in the wing.

Installation frames into which the servo-drive is snapped or locked when installed are known from German design patent G 93 14 366.4, and those that have an additional means for securing the servo-drive in the frame via a screwed joint are shown in German design patent G 298 01 836.5. Like the servo-drives, frames of this type have a rectangular shape. Because such frames enclose the casing directly, they permit installation in minimized recesses having a rectangular basic shape. However, it has been shown that a recess cut into the wing in a cornered form will fracture under stress via one of the corners, because an increased notch effect is caused there.

In order to reduce or exclude such an effect, a round installation container in the form of a can has been proposed by DE 4205 129 A1. A rectangular servo-drive is fixed the can by an adapter insert via conventional holding bridges, and is supported there on the bottom part. The round container or can permits a continuous introduction of force and thus does not produce any predetermined breaking points. Furthermore, the round recess offers the advantage that it can be easily prefabricated via a round milling machine during manufacture of wings produced in series.

However, this solution has the drawback that a substantially larger recess must be cut into the wing because the can must enclose the conventional casing with its holding means for the upright installation, and is consequently clearly larger than the area or space occupied by the basic elements of a servo-drive.

SUMMARY OF THE INVENTION

It is an object of the invention to provide a casing for a rudder machine in such a way that the circular recess in the wing that receives the rudder machine can be as small as possible compared to the dimensions of the rudder machine.

This object is accomplished in that the frame is in the form of a circular cylinder, and the shells of the casing of the rudder machine or servo drive jointly form an aggregate having the approximate shape of a circular cylinder whose diameter approximately corresponds with the width of the frame.

For the installation of such a novel type of servo-drive, there is a mounting ring in which the servo-drive casing can be inserted in an exactly fitted manner. The mounting ring is glued into a round recess in the wing, which was produced by cutting or milling. The servo-drive can be subsequently inserted in the frame and can be fixed there via screws.

Since the servo-drive has to be fitted in the frame, which is glued into the wing, in an exactly predetermined position, it is useful to provide suitable guides on the frame and the servo-drive, for example a guiding groove and a guiding bridge exactly fitting in the groove, which assures that the servo-drive can be removed from the mounting ring after it has been installed, and that it will be automatically seated again in exactly the same position in the mounting ring when it is reinserted in the frame.

The cylinder formed by the casing shells has an outer diameter approximately corresponding with the width of the frame. The plane of separation jointly formed by the shells of the casing extends parallel with the axis of rotation of the casing.

The shells of the casing are joined with each other by screws, rivets, glue or clips. The shells of the casing are joined with the frame by wedging, gluing, screwing and clipping.

At least one of the casing shells has a recess or opening within its radially outer side wall facing away from the plane of separation, so that an axis of swivel of the output arm of the servo extends approximately transversely in relation to the plane of separation, and the output arm is movable within this recess or opening.

In an alternative embodiment, the plane of separation jointly formed by the casing shells extends transversely to an axis of rotation of the casing.

BRIEF DESCRIPTION OF THE DRAWINGS

Other objects and features of the present invention will become apparent from the following detailed description considered in connection with the accompanying drawings. It is to be understood, however, that the drawings are designed as an illustration only and not as a definition of the limits of the invention.

In the drawings, wherein similar reference characters denote similar elements throughout the several views.

DETAILED DESCRIPTION OF THE PREFERRED EMBODIMENT

Figure 1A:
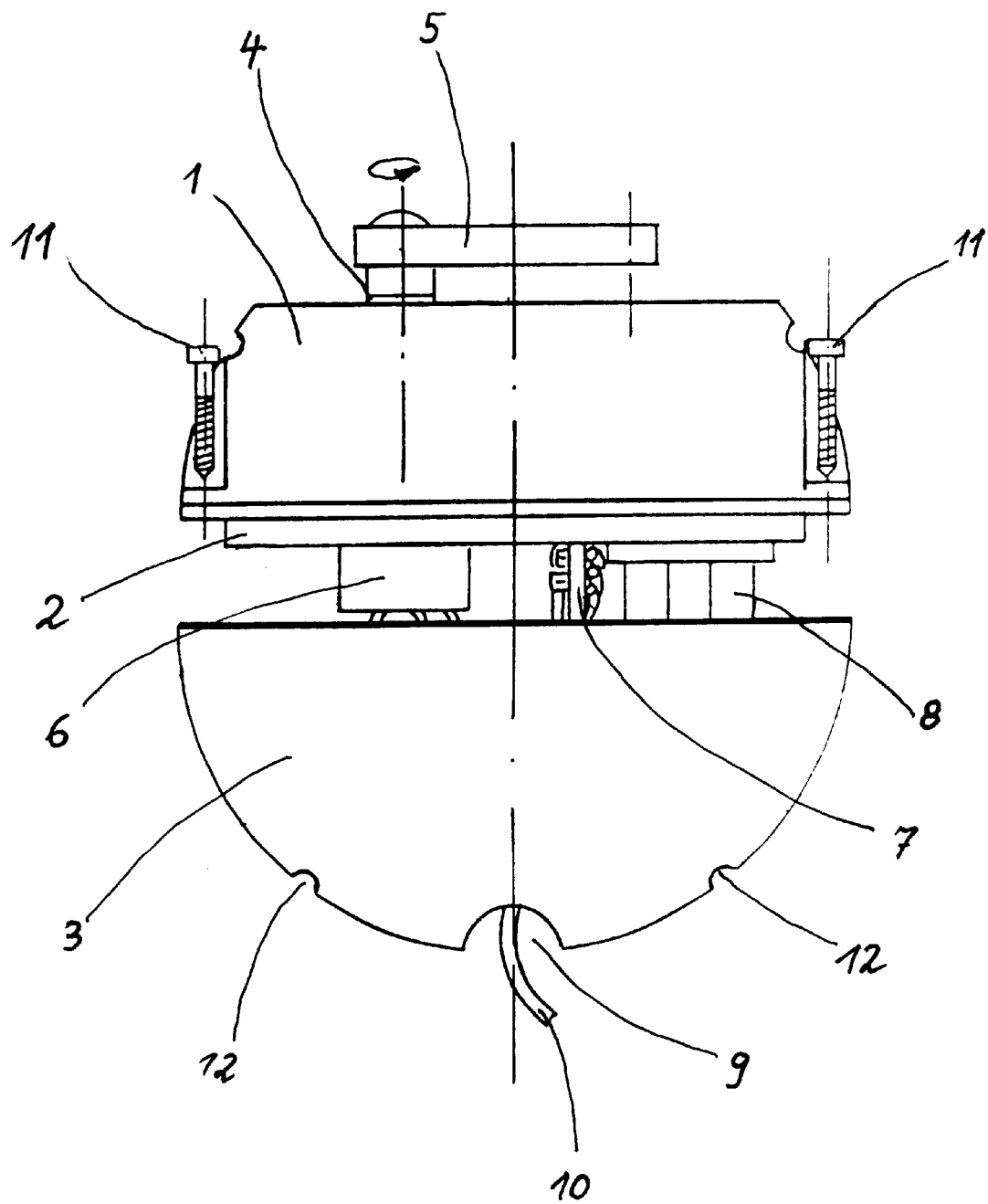
FIG. 1A shows a top view of the casing according to the invention.
Figure 1B:
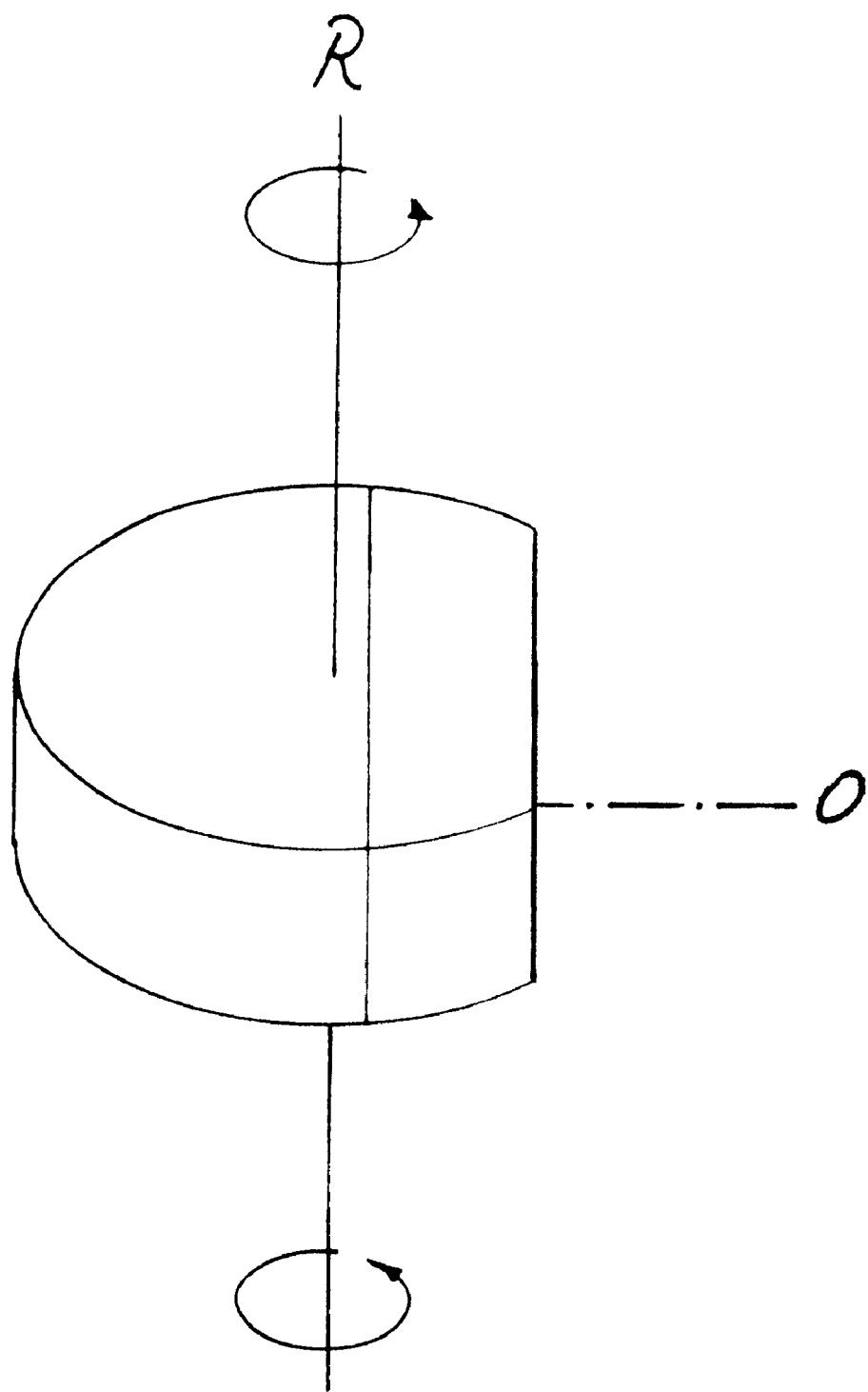
FIG. 1B shows a perspective view of the casing of FIG. 1A showing the axis of rotation.

Referring now in detail to the drawings, FIG. 1 shows a servo-drive with a round casing comprising a top component 1, a center component 2 and a bottom component 3. The servo-drive shown in FIG. 1 is axially divided, i.e. the plane of division of the casing extends perpendicular in relation to the driven shaft or perpendicular in relation to the motor shaft or to the shafts of the gearing. The separation joints formed by the shells of the casing thus are disposed parallel with the axis of rotation of the cylindrical casing._

This shape thus corresponds with the division of the casing of conventional servo-drives with rectangular casings.

The driven shaft 4 projects from top component 1 of the casing. An output arm 5 is mounted on shaft 4, which extends through a recess in top component 1. Output arm 5 has an axis of swivel A that extends perpendicular in relation to the plane of separation of the casing shells, and perpendicular to the axis of rotation R of the casing (see FIG. 1B). A potentiometer 6, amplifier electronics 7 and drive motor 8 are installed in the center component of the casing.

In the region of recess 9 on the bottom of the casing, there is a connection cable 10, which is the feed cable of the servo-drive, and which extends from the casing. Components 1, 2 and 3 of the casing are joined with one another on both sides of the casing via screws 11. Recesses provided in walls 12 of the casing fix the servo-drive in a mounting ring via screws.

Figure 2:
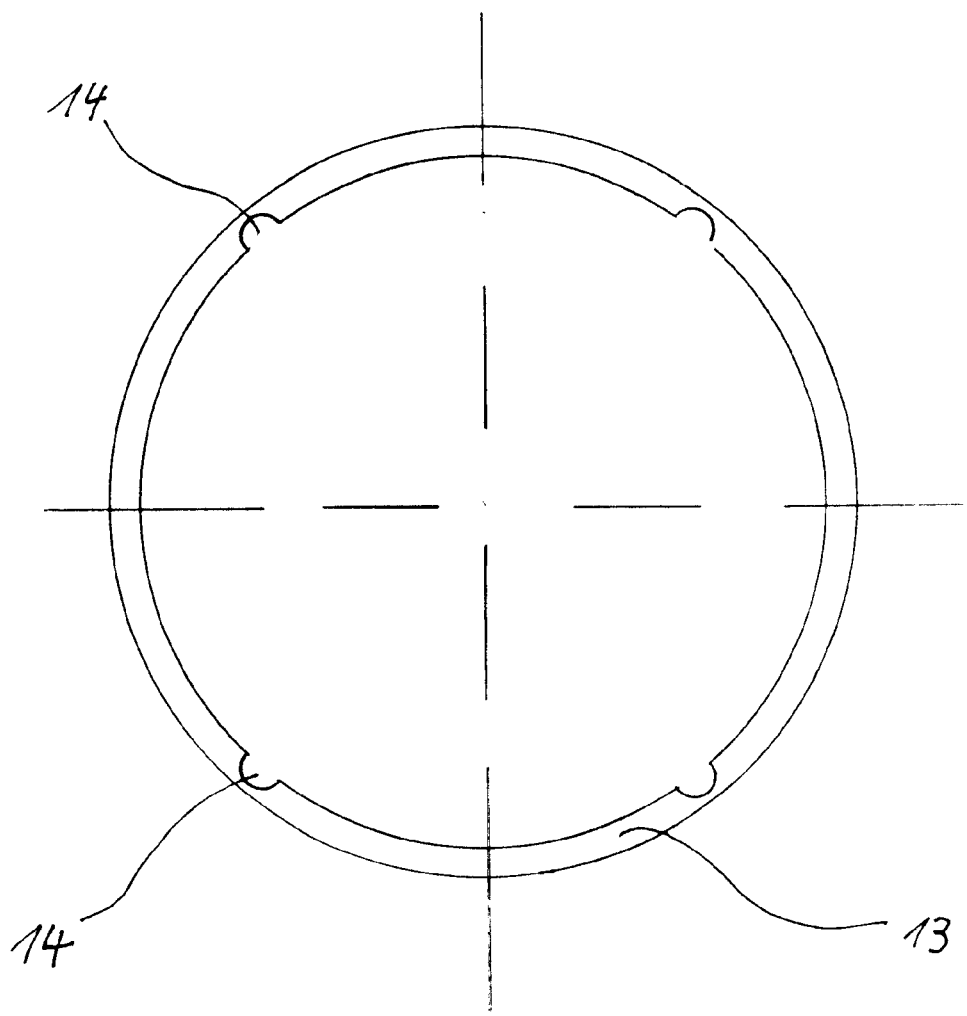
FIG. 2 shows a top view of a mounting ring for use with the casing according to the invention.

FIG. 2 shows a mounting ring 13 with four semi-circular recesses 14 on the inner walls, the recesses being provided to fix the servo-drive according to FIG. 1 via screws.

Figure 3:
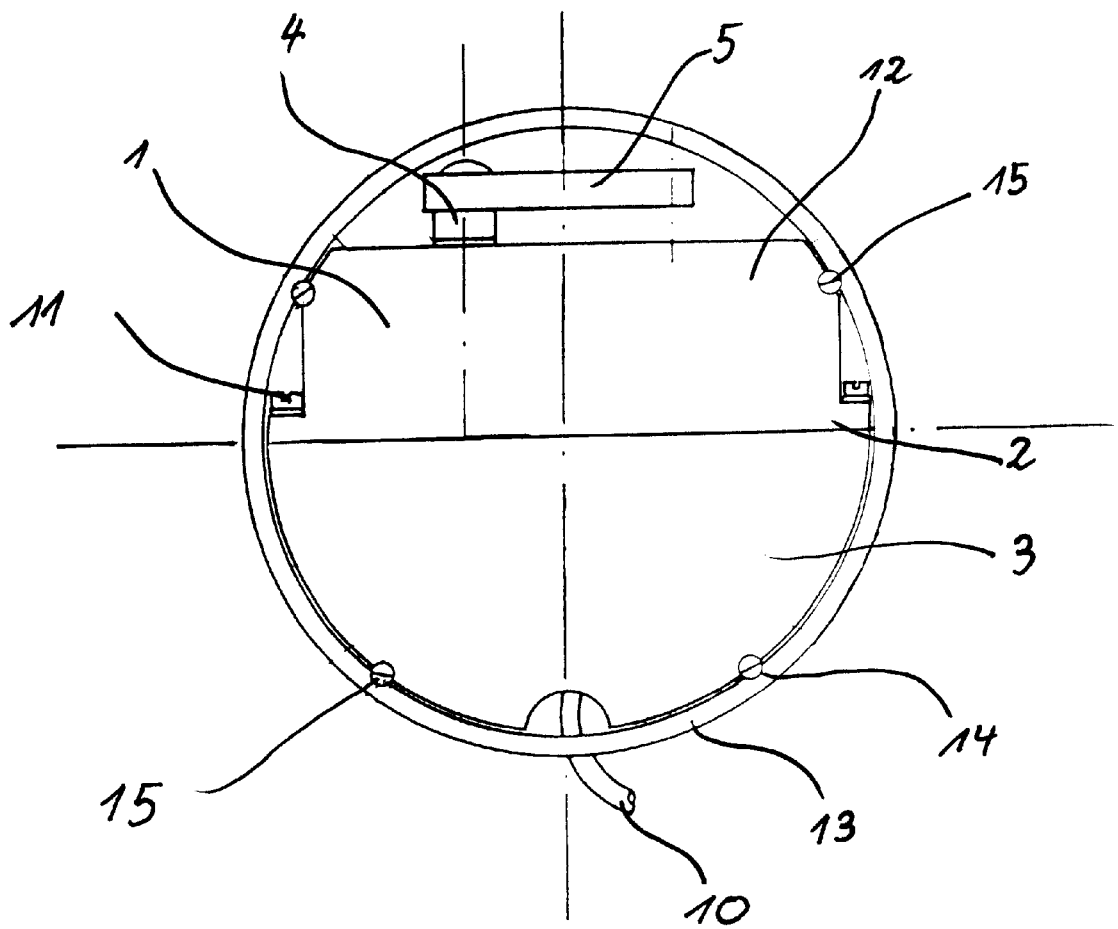
FIG. 3 shows a top view of a servo drive with a closed casing inserted into a mounting ring.

FIG. 3 shows the servo-drive according to FIG. 1 with the closed casing assembled via casing screws 11. The servo-drive is inserted in the mounting ring 13 and fixed in the latter via the four screws 15. The screws 15 at the same time engage the grooves of the servo-drive casing 12 as well as the grooves 14 of the mounting ring 13.

Figure 4A:
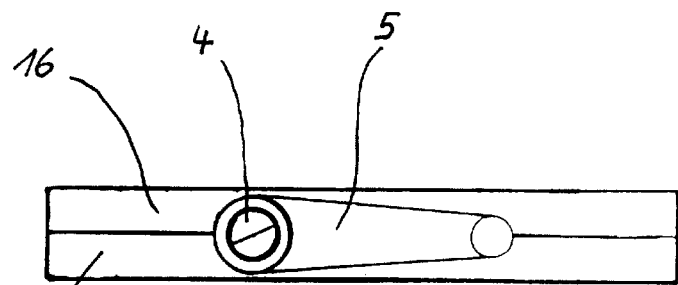
FIGS. 4A and 4B show side views of an alternative embodiment according to the invention.
Figure 4B:
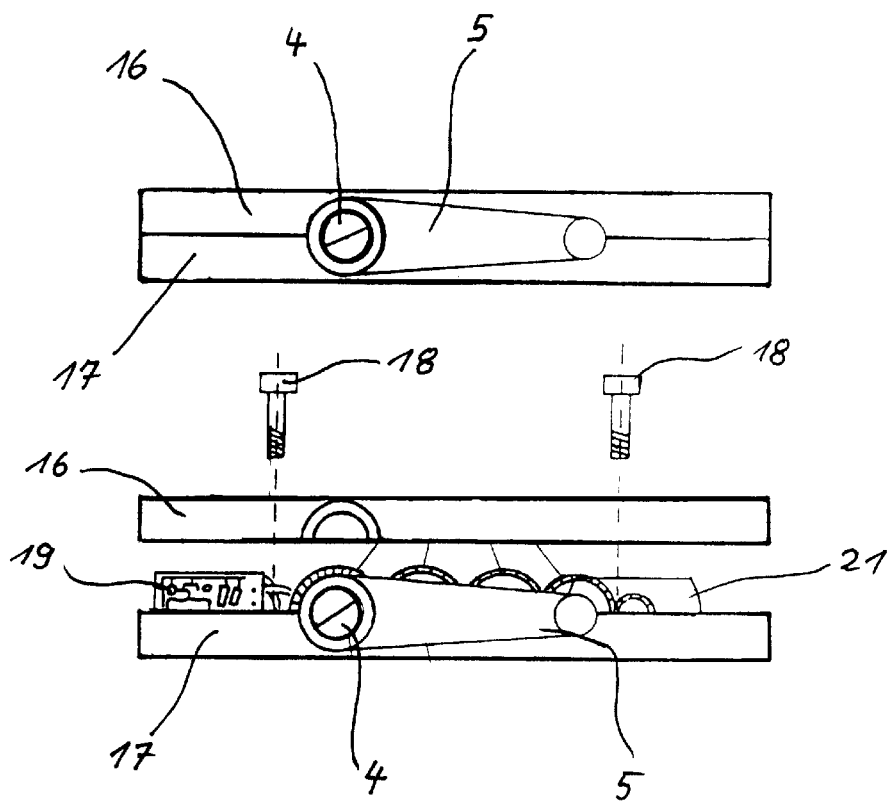
Figure 4C:
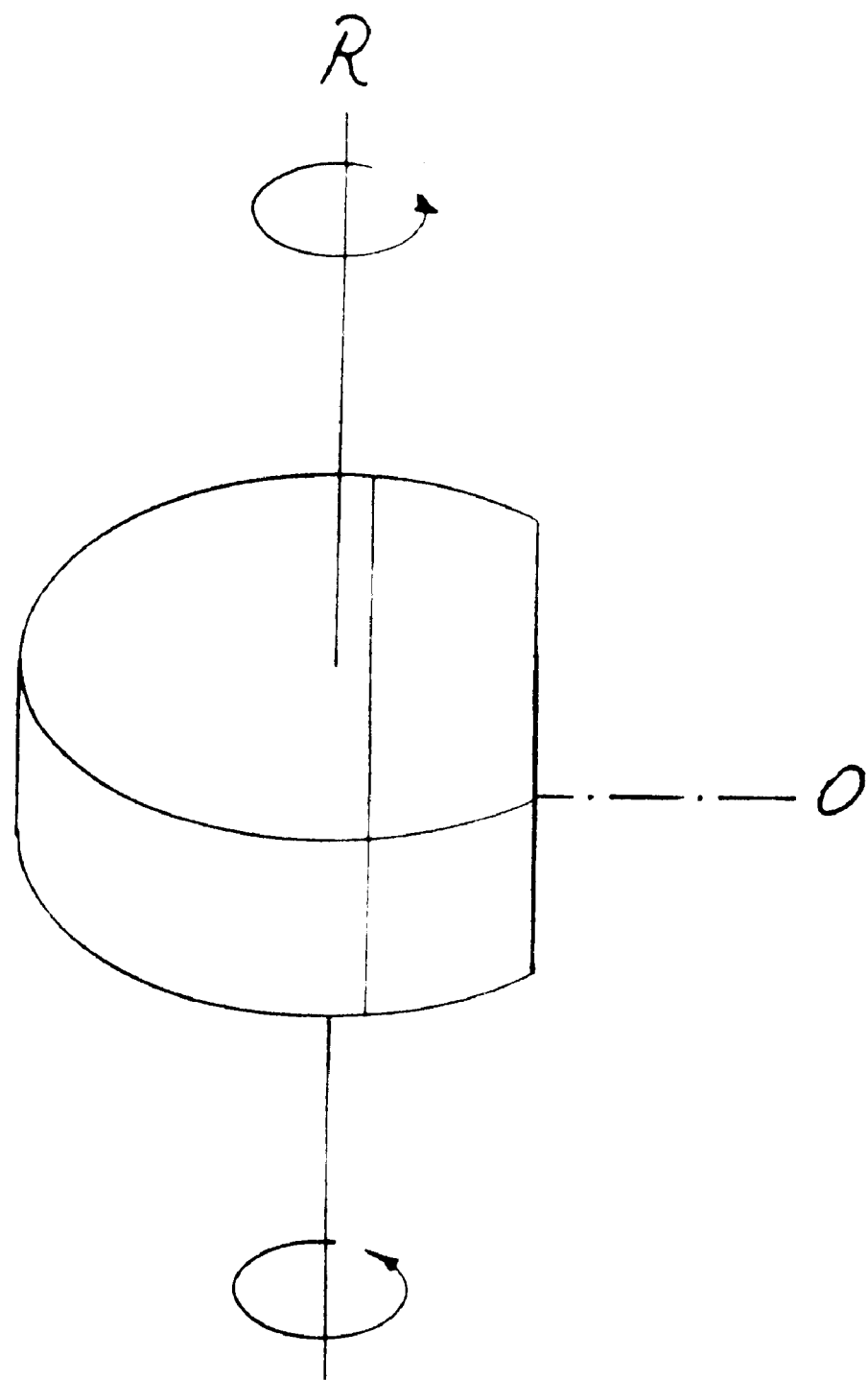
FIG. 4C shows a perspective view of the casing shown in FIGS. 4A and 4B, showing the axis of rotation of the casing.

FIGS. 4a and 4b shows an alternative embodiment that consists in placing the plane of division of the servo not axially but radially. FIG. 4C shows the axis of rotation of the casing.

The advantages of the embodiment shown in FIGS. 4A–4C lie in that the number of components of the casing is reduced from three, as above, to only two. Furthermore, dividing the casing in two parts offers a substantial advantage when the individual components are installed.

With a radial division of the casing, one obtains the two casing shells 16 and 17, of which one side can be designed as the mounting shell 17 in such a way that all components 19, 20 and 21 can be simply inserted or pre-mounted in the shell. Due to the enhanced accessibility as compared to the conventional type of construction, it is possible to reduce the installation time.

The components are maintained in their correct positions by attaching the second shell of the casing on top. The two casing shells 16 and 17 are joined with each other via screws. In the present case, the separation joint (plane of separation) jointly formed by the casing shells is disposed transversely in relation to the axis of rotation of the casing, which has the approximate shape of a circular cylinder.

FIG. 4a shows the closed servo-drive comprising the top half 16 and the bottom half 17 of the casing. FIG. 4b shows the same servo-drive in the open condition. The components such as the amplifier 19, the toothed gears 20 and the motor 21 can be seen installed in the lower half 17 (mounting shell) of the casing. After the casing has been closed, the two halves 16 and 17 of the casing are connected with each other via screws 18. The plane of separation between halves 16 and 17 is perpendicular to the axis of rotation R of the casing.

Figure 5:
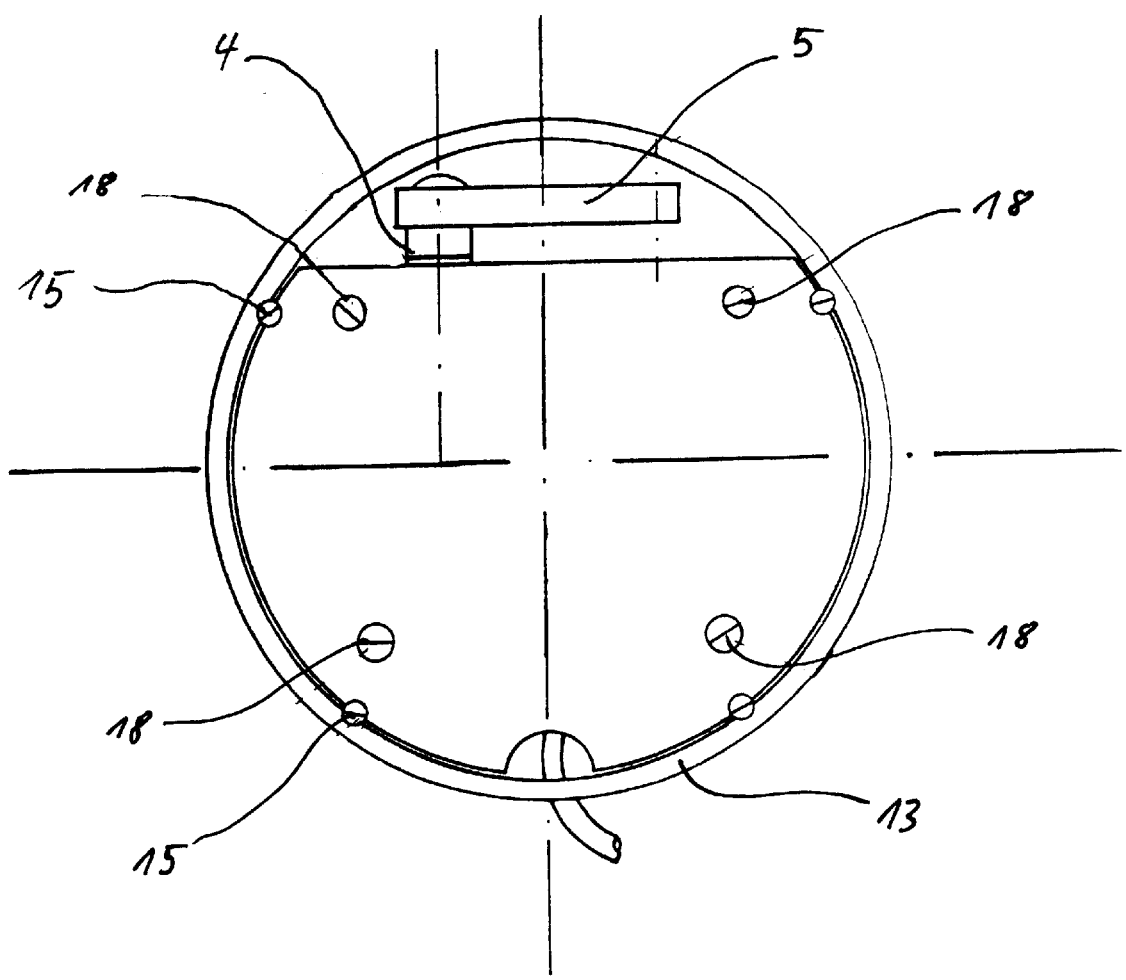
FIG. 5 shows a top view of the servo-drive and casing according to FIG. 4 inserted into a mounting ring.

FIG. 5 shows the servo-drive according to FIG. 4 with the casing closed via casing screws 18, and inserted in the mounting ring 13 and fixed via four screws 15. Screws 15 engage grooves of the servo-drive casing as well as grooves 14 of mounting ring 13.

It is, of course, understood that a casing with the shape of a circular cylinder for the rudder machine (servo-drive) associated with the radio receiver of a remote control system for vehicle models, in particular aircraft models, can be designed to comprise two or more parts, whereby the separating joints (planes of separation) formed by the components of the casing may extend perpendiculal, parallel, or inclined in relation to the axis of rotation.

Accordingly, while only a few embodiments of the present invention have been shown and described, it is obvious that many changes and modifications may be made thereunto without departing from the spirit and scope of the invention.

What is claimed is:

1. A casing for a servo-drive associated with the radio receiver of a remote control system for a vehicle model, the servo-drive having a setting member or output arm connectable to a control part of the vehicle model, comprising:
   a circular cylindrical mounting frame rigidly connectable with the vehicle model, for enclosing and supporting the servo-drive,
   a plurality of casing shells for the servo drive, the aggregate of said casing shells having a shape of an approximately circular cylinder, said cylinder having an outer diameter approximately corresponding with the width of the frame, wherein a plane of separation jointly formed by the shells extends parallel with an axis of rotation of the casing.

2. The casing according to claim 1, wherein the shells are joined with each other by fasteners selected from the group consisting of screws, rivets, glue and clips.

3. The casing according to claim 1, wherein the shells are joined with the frame by a method selected from the group consisting of wedging, gluing, screwing and clipping.

4. The casing according to claim 1 wherein at least one of the casing shells has a radially outer side wall facing away from the plane of separation and a recess within said radially outer side wall, wherein an axis of swivel of the output arm of the servo approximately extends perpendicular in relation to the plane of separation, and wherein the output arm is movable within said recess.

5. A casing for a servo-drive associated with the radio receiver of a remote control system for vehicle models, the servo-drive having a setting member or output arm connectable with a control part of the vehicle model, comprising:
   a circularly cylindrical mounting frame rigidly connectable with the vehicle model, for enclosing and supporting the servo-drive;
   at least two components which jointly form an approximately circular cylindrical aggregate whose outer diameter approximately corresponds with the width of the frame, wherein a plane of separation jointly formed by the components extends perpendicular to an axis of rotation of the casing.

6. The casing according to claim 5, wherein the components are joined with each other by fasteners selected from the group consisting of screws, rivets, glue and clips.

7. The casing according to claim 5, wherein the assembled components are joined with the circularly cylindrical frame by a method selected from the group consisting of wedging, screwing and clipping.

8. The casing according to claim 5, wherein at least one of the components has a recess within its radially outer side wall, and that the output arm of the servo-drive is movable within the space formed by the recess.

9. A casing in combination with a servo-drive associated with the radio receiver of a remote control system for vehicle models, the servo-drive having a setting member or output arm connectable with the control part of the vehicle model, wherein the casing has an approximately circularly cylindrical configuration, and wherein the setting member or output arm extends in a position selected from the group consisting of perpendicular, parallel and inclined, in relation to an axis of rotation of the casing.

10. The casing and servo-drive combination according to claim 9, wherein the casing comprises at least two shells, separated by a separation joint that extends perpendicular or parallel with the axis of rotation of the casing.

11. The casing and servo-drive combination according to claim 10, wherein in at least one of the shells has a radially outer side wall and a recess within said radially outer side wall, and wherein the outer arm is movable within the space formed by the recess.

12. The casing and servo-drive combination according to claim 10, wherein at least one of the shells of the casing has an axially outer side wall and a recess within said axially outer side wall, and wherein the setting member or output arm moves within said recess parallel with an axis of rotation of the casing.

* * * * *